(12) United States Patent
Yoshida et al.

(10) Patent No.: US 11,898,247 B2
(45) Date of Patent: Feb. 13, 2024

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Hidenari Yoshida, Toyama (JP); Takafumi Sasaki, Toyama (JP); Yusaku Okajima, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 400 days.

(21) Appl. No.: 17/204,240

(22) Filed: Mar. 17, 2021

(65) Prior Publication Data
US 2021/0207268 A1 Jul. 8, 2021

Related U.S. Application Data

(63) Continuation of application No. PCT/JP2018/034890, filed on Sep. 20, 2018.

(51) Int. Cl.
*C23C 16/458* (2006.01)
*C23C 16/34* (2006.01)
(Continued)

(52) U.S. Cl.
CPC .......... *C23C 16/4588* (2013.01); *C23C 16/34* (2013.01); *C23C 16/4412* (2013.01); *H01L 21/32051* (2013.01)

(58) Field of Classification Search
CPC ............... H01L 21/32051; H01L 21/31; H01L 21/67303; H01L 21/683; H01L 21/68;
(Continued)

(56) References Cited

U.S. PATENT DOCUMENTS 5,297,956 A * 3/1994 Yamabe .................. C30B 31/12
432/5
5,516,283 A * 5/1996 Schrems ........... H01L 21/67309
432/5
(Continued)

FOREIGN PATENT DOCUMENTS

JP 09-092623 A 4/1997
JP 2003-303782 A 10/2003
(Continued)

OTHER PUBLICATIONS

Intellectual Property Office of Singapore Office Action dated Jan. 18, 2022 for Singapore Patent Application No. 11202102655Y.
(Continued)

*Primary Examiner* — Mouloucoulaye Inoussa
(74) *Attorney, Agent, or Firm* — Volpe Koenig (57) ABSTRACT

Described herein is a technique capable of adjusting a balance in film thickness between surfaces of a plurality of substrates stacked in a process chamber. According to one aspect of the technique, there is provided a method of manufacturing a semiconductor device, including: a process chamber capable of accommodating a plurality of substrates; a gas supplier configured to supply a process gas to the plurality of the substrates in the process chamber; a gas exhauster configured to discharge the process gas from the process chamber; and a plurality of disks interposed between the plurality of the substrates, respectively, and in vicinity of back surfaces of the plurality of the substrates.

19 Claims, 9 Drawing Sheets

(51) Int. Cl.
*C23C 16/44* (2006.01)
*H01L 21/3205* (2006.01)

(58) Field of Classification Search
CPC ......... H01L 21/67309; H01L 21/67109; H01L 21/28506; H01L 21/67017; H01L 21/22; H01L 21/67742; H01L 21/67757; H01L 21/67276; H01L 21/67781; H01L 21/67754; H01L 29/4966; H01L 21/28562; H01L 29/517; H01L 29/513; H01L 21/0228; H01L 21/02211; H01L 21/02164; H01L 21/02274; H01L 23/53252; H01L 21/67196; H01L 21/68771; H01L 21/67167; H01L 21/76877; H01L 21/76814; H01L 21/6719; H01L 21/76862; H01L 21/76844; H01L 21/68764; H01L 21/76876; H01L 27/092; H01L 21/28088; H01L 21/823842; H01L 21/31116; H01L 21/02315; H01L 21/02219; H01L 21/0201; H01L 21/02035; C23C 16/4584; C23C 16/4588; C23C 16/45546; C23C 16/34; C23C 16/4412; C23C 16/458; C23C 16/45591; C23C 16/4583; C23C 16/45525; C23C 16/4585; C23C 16/02; C23C 16/045; C23C 28/02; C23C 16/45553; C23C 16/0227; C23C 16/45551; C23C 16/45534; C23C 16/06; C23C 16/45542; C23C 16/45578; C23C 16/509; C23C 16/4586; C23C 16/452; C23C 16/345; C23C 16/402; G03F 7/70808; G03F 7/0042; G03F 7/168; G03F 7/70033; G03F 7/0043; G03F 7/16; G05B 19/418; H01J 37/32899; H01J 37/32532; H01J 37/32651; H01J 37/32; H01J 37/32009; H01J 37/321; H01J 37/20; H01J 37/32779; H01J 2237/038; H10B 43/27
USPC ....... 438/770, 771, 758, 791, 775, 792, 798, 438/680, 761, 909, 778, 783, 660, 907, 438/774; 257/727, E21.282, E21.211, 257/E21.563, E21.269, E21.279, E21.576; 156/345.33, 345.44; 700/96
See application file for complete search history.

(56) References Cited

U.S. PATENT DOCUMENTS

| | | | | |
|---|---|---|---|---|
| 5,782,361 A | * | 7/1998 | Kakizaki | H01L 21/6732 206/508 |
| 5,897,311 A | * | 4/1999 | Nishi | H01L 21/67309 432/239 |
| 9,018,689 B1 | * | 4/2015 | Hirochi | C23C 16/45523 257/E21.038 |
| 10,332,747 B1 | * | 6/2019 | Watanabe | C23C 16/042 |
| 11,574,829 B2 | * | 2/2023 | Lee | H01L 21/67309 |
| 2008/0199610 A1 | * | 8/2008 | Inokuchi | C23C 16/45578 118/729 |
| 2008/0264343 A1 | * | 10/2008 | Hagihara | H01L 21/67748 118/728 |
| 2012/0240857 A1 | * | 9/2012 | Morozumi | H01L 21/67109 118/725 |
| 2013/0213910 A1 | | 8/2013 | Kang et al. | |
| 2014/0038394 A1 | | 2/2014 | Watanabe et al. | |
| 2015/0322568 A1 | * | 11/2015 | Kumagai | C23C 16/45551 427/255.28 |
| 2016/0053373 A1 | * | 2/2016 | Inada | C23C 16/34 438/778 |
| 2016/0233085 A1 | * | 8/2016 | Yamaguchi | C23C 16/30 |
| 2017/0011926 A1 | * | 1/2017 | Harada | C23C 16/45529 |
| 2017/0092489 A1 | * | 3/2017 | Ishizaka | H01L 21/0234 |
| 2017/0114464 A1 | * | 4/2017 | Iriuda | C23C 16/4584 |
| 2017/0268105 A1 | * | 9/2017 | Takeda | C23C 16/401 |
| 2017/0335458 A1 | * | 11/2017 | Murata | H01L 21/67109 |
| 2018/0033618 A1 | * | 2/2018 | Ogawa | C23C 16/402 |
| 2018/0080122 A1 | * | 3/2018 | Ogawa | C23C 16/34 |
| 2018/0135169 A1 | * | 5/2018 | Ishizaka | C23C 16/52 |
| 2018/0187307 A1 | * | 7/2018 | Yoshida | C23C 16/345 |
| 2018/0247819 A1 | * | 8/2018 | Ogawa | H10B 12/03 |
| 2018/0265974 A1 | * | 9/2018 | Okura | H01L 21/28556 |
| 2018/0311700 A1 | * | 11/2018 | Ashizawa | H01L 21/76843 |
| 2018/0374734 A1 | * | 12/2018 | Hirano | C23C 16/458 |
| 2019/0032998 A1 | * | 1/2019 | Jdira | F27D 3/0084 |
| 2019/0093224 A1 | * | 3/2019 | Yoshida | C23C 16/45502 |
| 2019/0163056 A1 | * | 5/2019 | Maes | G03F 7/70808 |
| 2019/0218664 A1 | * | 7/2019 | Yamamoto | H01J 37/3211 |
| 2019/0242015 A1 | * | 8/2019 | Ohashi | C23C 16/00 |
| 2020/0219745 A1 | * | 7/2020 | Okazaki | H01L 21/22 |
| 2020/0312632 A1 | * | 10/2020 | Hara | H01J 37/3244 |
| 2020/0407851 A1 | * | 12/2020 | Hiramatsu | B25B 11/005 |
| 2021/0407828 A1 | * | 12/2021 | Park | H01L 21/67103 |

FOREIGN PATENT DOCUMENTS

| | | |
|---|---|---|
| JP | 2004-047767 A | 2/2004 |
| JP | 2004-111781 A | 4/2004 |
| JP | 2005-108988 A | 4/2005 |
| JP | 3819660 B | 9/2006 |
| JP | 2010-258235 A | 11/2010 |
| JP | 2014-033143 A | 2/2014 |
| JP | 2017-079289 A | 4/2017 |
| WO | 2017138185 A1 | 8/2017 |

OTHER PUBLICATIONS

Japanese Office Action dated May 30, 2022 for Japanese Patent Application No. 2020-547556.
Korean Office Action dated Nov. 15, 2022 for Korean Patent Application No. 10-2021-7007834.
Singapore Written Opinion dated Jun. 13, 2023 for Singapore Patent Application No. 11202102655Y.

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of International Application No. PCT/JP2018/034890, filed on Sep. 20, 2018, in the WIPO, the entire contents of which are hereby incorporated by reference.

FIELD

The present disclosure relates to a substrate processing technique such as a substrate processing apparatus, a substrate retainer, a method of manufacturing a semiconductor device, a program and a non-transitory computer-readable recording medium.

DESCRIPTION OF THE RELATED ART

In a substrate processing apparatus such as a vertical type film-forming apparatus, when a film is formed by supplying a gas using a multi-hole nozzle (porous nozzle), a thickness of the film on a substrate located at an upper portion of a boat may be different from a thickness of the film on a substrate located at a lower portion of the boat. This may cause a deterioration in uniformity (for example, a thickness uniformity of the film) between the plurality of the substrates loaded in the boat.

Various configurations have been proposed in order to prevent the deterioration of a substrate quality in the conventional substrate processing apparatus. However, in such configurations, the gas may not be supplied uniformly to a surface of each of the plurality of the substrates.

SUMMARY

Described herein is a technique capable of adjusting a balance in film thickness between surfaces of a plurality of substrates stacked in a process chamber.

According to one aspect of the technique of the present disclosure, there is provided a substrate processing apparatus including: a process chamber capable of accommodating a plurality of substrates; a gas supplier configured to supply a process gas to the plurality of the substrates in the process chamber; a gas exhauster configured to discharge the process gas from the process chamber; and a plurality of disks interposed between the plurality of the substrates, respectively, and in vicinity of back surfaces of the plurality of the substrates.

DETAILED DESCRIPTION

Embodiments

Hereinafter, one or more embodiments (also simply referred to as "embodiments") according to the technique of the present disclosure will be described with reference to the drawings. First, with reference to FIGS. 1 through 3, an exemplary configuration and an exemplary operation of a substrate processing apparatus according to the embodiments will be described using a vertical type heat treatment apparatus.

(1) Basic Configuration of Substrate Processing Apparatus

Figure 1:
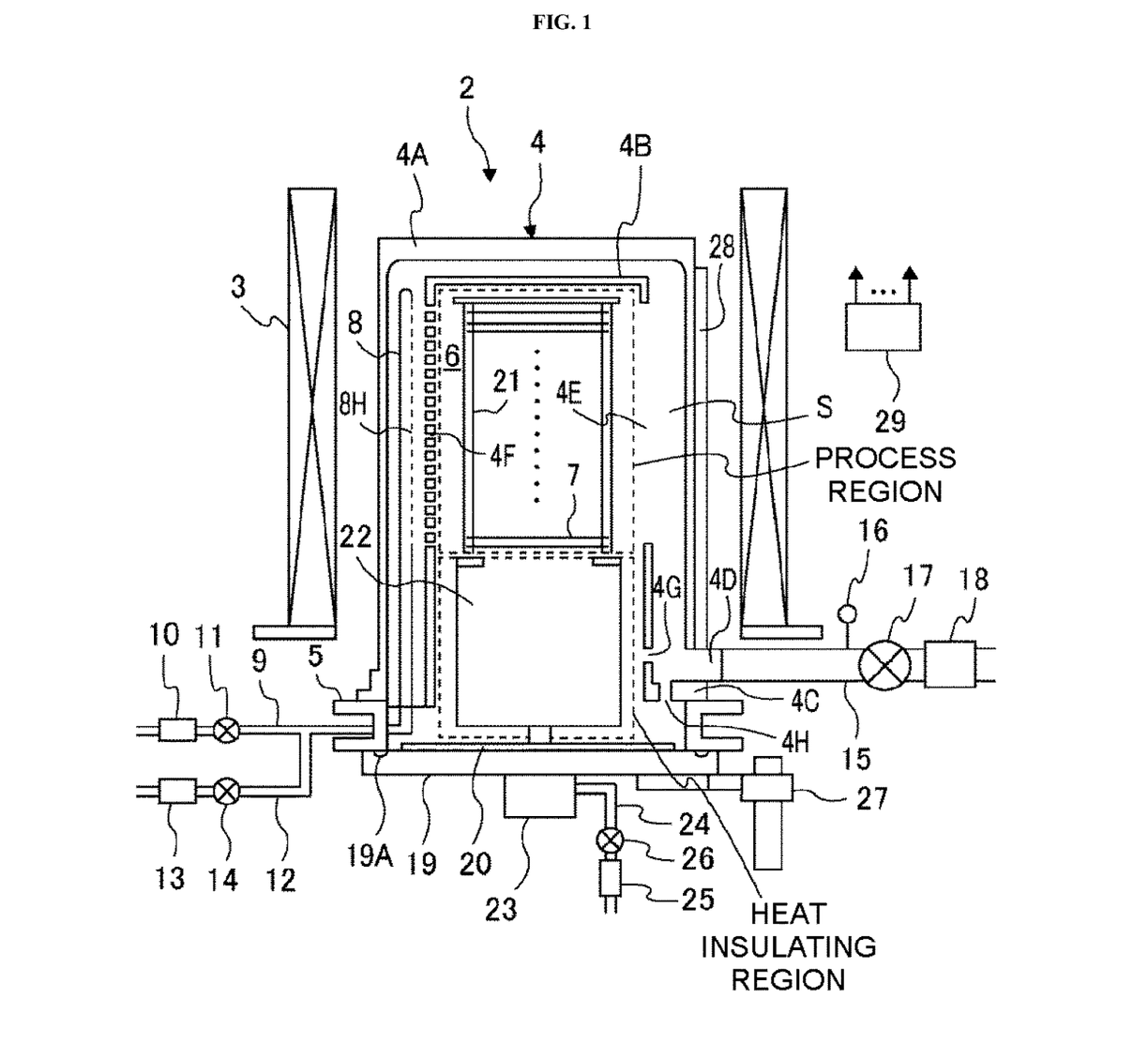
FIG. 1 schematically illustrates a vertical cross-section of a basic configuration of a substrate processing apparatus according to one or more embodiments described herein.

As shown in FIG. 1, a substrate processing apparatus 2 according to the embodiments described herein is configured as a vertical type heat treatment apparatus. The substrate processing apparatus 2 includes a heater 3 in order to uniformly heat a process chamber 6. The heater 3 is constituted by a plurality of heating structures. The heater 3 is of a cylindrical shape, and is installed perpendicular to an installation floor of the vertical type heat treatment apparatus (that is, the substrate processing apparatus 2) while being supported by a heater base (not shown) serving as a support plate. The heater 3 also functions as an activator (also referred to as is an "exciter") capable of activating (exciting) process gases by heat as described later.

A reaction tube 4 is provided on an inner side of the heater 3. For example, the reaction tube 4 is made of a heat resistant material such as quartz ($SiO_2$) and silicon carbide (SiC). The reaction tube 4 is of a cylindrical shape with an open lower end and a closed upper end. The reaction tube 4 is embodied by a double tube structure including an outer tube 4A and an inner tube 4B that are coupled to each other at a flange 4C. The flange 4C is provided at the lower end of the reaction tube 4. Upper ends of the outer tube 4A and the inner tube 4B are closed and a lower end of the inner tube 4B is open. The process chamber 6 indicated by a broken line in FIG. 1 is defined by the inner tube 4B. An outer diameter of the flange 4C is greater than an outer diameter of the outer tube 4A. The flange 4C protrudes outward from an outer periphery of the outer tube 4A. An exhaust outlet 4D communicating with an inside of the outer tube 4A is provided in the vicinity of the lower end of the reaction tube 4. The reaction tube 4 including the above described components such as the outer tube 4A and the inner tube 4B is formed as a single body of a single material. The outer tube 4A is relatively thick so as to withstand a pressure difference when the inside thereof is exhausted to vacuum.

A manifold 5 of a cylindrical shape or of a truncated cone shape is made of a metal or quartz, and is provided to support the lower end of the reaction tube 4. An inner diameter of the manifold 5 is greater than an inner diameter of the reaction tube 4 (and an inner diameter of the flange 4C). Thereby, an annular space is defined between the lower end of the reaction tube 4 (that is, the flange 4C) and a seal cap 19 described later.

The inner tube 4B is provided with a main exhaust port 4E and a plurality of supply slits 4F. The main exhaust port 4E is provided at the inner tube 4B closer to a center of the reaction tube 4 than the exhaust outlet 4D. The main exhaust port 4E is configured to communicate with an inside and an outside of the inner tube 4B on a side thereof. The supply slits 4F are provided (bored) at the inner tube 4B at positions opposite to the main exhaust port 4E. The main exhaust port 4E is a single vertically elongated opening that opens to a region where a plurality of wafers including a wafer 7 are disposed. Each of the supply slits 4F is a slit extending in a circumferential direction of the inner tube 4B. The supply slits 4F are arranged both in the horizontal direction and in the vertical direction so as to face each of the wafers including the wafer 7.

In addition, the inner tube 4B is provided with a plurality of subsidiary exhaust ports 4G. The subsidiary exhaust ports 4G are provided at the inner tube 4B closer to the center of the reaction tube 4 than the exhaust outlet 4D and closer to a lower end opening of the reaction tube 4 than the main exhaust port 4E. The subsidiary exhaust ports 4G are configured such that the process chamber 6 and an exhaust space S communicate with each other through the subsidiary exhaust ports 4G, wherein the exhaust space S is a space between the outer tube 4A and the inner tube 4B. The flange 4C is also provided with a plurality of bottom exhaust ports 4H. The bottom exhaust ports 4H are configured such that the process chamber 6 and a lower end of the exhaust space S communicate with each other through the bottom exhaust ports 4H. In other words, the lower end of the exhaust space S is closed by the flange 4C except where the bottom exhaust ports 4H and a nozzle introduction hole (not shown) are provided. The subsidiary exhaust ports 4G and the bottom exhaust ports 4H are configured such that a shaft purge gas described later is exhausted therethrough.

In the exhaust space S, one or more nozzles 8 configured to supply the process gases such as a source gas are provided at locations corresponding to the positions of the supply slits 4F. One or more gas supply pipes 9 configured to supply the process gases such as a TiCl$_4$ gas and a NH$_3$ gas are connected to the one or more nozzles 8 through the manifold 5, respectively. A mass flow controller (MFC) 10 serving as a flow rate controller and a valve 11 serving as an opening/closing valve are sequentially installed on flow paths of the one or more gas supply pipes 9, respectively, from upstream sides to downstream sides thereof. One or more gas supply pipes 12 configured to supply an inert gas are connected to the one or more gas supply pipes 9, respectively, at a downstream side of the valve 11. An MFC 13 and a valve 14 are sequentially installed at the one or more gas supply pipes 12, respectively, from upstream sides to downstream sides thereof. Hereinafter, the one or more nozzles 8 may also be collectively or individually referred to as a "nozzle 8", the one or more gas supply pipes 9 may also be collectively or individually referred to as a "gas supply pipe 9", and the one or more gas supply pipes 12 may also be collectively or individually referred to as a "gas supply pipe 12". Further, the nozzle 8, the gas supply pipe 9, the MFC 10 and the valve 11 provided to supply the TiCl$_4$ gas may also be referred to the nozzle 8 for the TiCl$_4$ gas, the gas supply pipe 9 for the TiCl$_4$ gas, the MFC 10 for the TiCl$_4$ gas and the valve 11 for the TiCl$_4$ gas, respectively; and the nozzle 8, the gas supply pipe 9, the MFC 10 and the valve 11 provided to supply the NH$_3$ gas may also be referred to the nozzle 8 for the NH$_3$ gas, the gas supply pipe 9 for the NH$_3$ gas, the MFC 10 for the NH$_3$ gas and the valve 11 for the NH$_3$ gas, respectively. A process gas supplier serving as a process gas supply system is constituted mainly by the gas supply pipe 9, the MFC 10 and the valve 11. The process gas supplier may also be simply referred to as a "gas supplier".

The nozzle 8 is provided in the reaction tube 4 so as to extend straight from a lower portion of the reaction tube 4 toward an upper portion of the reaction tube 4. A gas supply hole or a plurality of gas supply holes 8H through which a gas of such as the process gases is supplied may be provided on an upper end or a side surface of the nozzle 8. The gas supply holes 8H are open to face the openings of the supply slits 4F, respectively. The gas supply holes 8H are open toward the center of the reaction tube 4. As a result, it is possible to inject the gas toward the wafers including the wafer 7 through the inner tube 4B.

An exhaust pipe 15 configured to exhaust an inner atmosphere of the process chamber 6 is connected to the exhaust outlet 4D. A vacuum pump 18 serving as a vacuum exhaust apparatus is connected to the exhaust pipe 15 through a pressure sensor 16 and an APC (Automatic Pressure Controller) valve 17. The pressure sensor 16 serves as a pressure detector (also referred to as a "pressure meter") to detect an inner pressure of the process chamber 6, and the APC valve 17 serves as a pressure regulator (also referred to as a "pressure controller"). With the vacuum pump 18 in operation, the APC valve 17 may be opened or closed to exhaust (vacuum-exhaust) the inner atmosphere of the process chamber 6 or stop the vacuum exhaust. With the vacuum pump 18 in operation, an opening degree of the APC valve 17 may be adjusted based on pressure information detected by the pressure sensor 16, in order to control the inner pressure of the process chamber 6. An exhauster (which is an exhaust system) is constituted mainly by the exhaust pipe 15, the APC valve 17 and the pressure sensor 16. The exhauster may further include the vacuum pump 18. The exhauster may also be simply referred to as a "gas exhauster".

The seal cap 19 serving as a furnace opening lid capable of airtightly sealing a lower end opening of the manifold 5 is provided under the manifold 5. The seal cap 19 is made of a metal such as SUS (stainless steel) and a nickel-base alloy, and is of a disk shape. An O-ring 19A serving as a seal is provided on an upper surface of the seal cap 19 so as to be in contact with the lower end of the manifold 5.

A cover plate 20 is provided on the upper surface of the seal cap 19 so as to protect a portion of the seal cap 19 inner than an inner periphery of the lower end of the manifold 5. The cover plate 20 is made of a heat and corrosion resistant material such as quartz, sapphire and SiC, and is of a disk shape. Since it is possible for the cover plate 20 to retain small mechanical strength, the cover plate 20 may be formed with a small thickness. In addition, it is unnecessary for the cover plate 20 to be prepared independently of the seal cap 19. For example, the cover plate 20 may be embodied by a film or a layer such as a nitride film coated on an inner surface of the seal cap 19 and a nitride film formed by modifying the inner surface of the seal cap 19. The cover plate 20 may further include a wall extending along an inner surface of the manifold 5 from a circumferential edge of the cover plate 20.

A boat 21 serving as a substrate retainer is configured to align the wafers (including the wafer 7) whose total number is within a range, for example, from 25 to 200 in the vertical direction so as to support the wafers in a multistage manner while the wafers are horizontally oriented with their centers aligned with each other. That is, the boat 21 supports the wafers including the wafer 7 with predetermined intervals therebetween. The boat 21 is made of a heat resistant material such as quartz and SiC. It is preferable to minimize an inner diameter of the reaction tube 4 as long as the boat 21 can be safely transferred into and out of the reaction tube 4.

A heat insulating assembly 22 is disposed below the boat 21. The heat insulating assembly 22 is embodied by a structure in which conduction or transmission of the heat tends to reduce in the vertical direction, and usually a cavity is provided in the heat insulating assembly 22. It is possible to purge an inside of the heat insulating assembly 22 with the shaft purge gas. The upper portion of the reaction tube 4 where the boat 21 is disposed may be referred to as a "process region", and the lower portion of the reaction tube 4 where the heat insulating assembly 22 is disposed may be referred to as a "heat insulating region".

A rotator 23 configured to rotate the boat 21 is provided under the seal cap 19 opposite to the reaction tube 4. A gas supply pipe 24 of the shaft purge gas is connected to the rotator 23. An MFC 25 and a valve 26 are sequentially installed at the gas supply pipe 24 from an upstream side to a downstream side of the gas supply pipe 24. One purpose of the shaft purge gas is to protect an inside of the rotator 23 (for example, bearings) from the gas such as a corrosive gas used in the reaction tube 4. The shaft purge gas is discharged from the rotator 23 along a shaft of the rotator 23 and is guided into the heat insulating assembly 22.

A boat elevator 27 is provided outside the reaction tube 4 vertically below the reaction tube 4. The boat elevator 27 serves as an elevator (or a transfer device) capable of elevating and lowering the seal cap 19. When the seal cap 19 is moved upward or downward by the boat elevator 27, the boat 21 supported by the seal cap 19 and the wafers including the wafer 7 accommodated in the boat 21 may be transferred into or out of the process chamber 6. There may be provided a shutter (not shown) configured to, instead of the seal cap 19, close the lower end opening of the manifold 5 while the seal cap 19 is being lowered to a lowest position thereof.

A temperature detector 28 is installed on an outer wall of the outer tube 4A. The temperature detector 28 may be embodied by a plurality of thermocouples arranged in a vertical array. The state of electric conduction to the heater 3 may be adjusted based on temperature information detected by the temperature sensor 28 such that a desired temperature distribution of an inner temperature of the process chamber 6 can be obtained.

A controller 29 is constituted by a computer configured to control the entire substrate processing apparatus 2. The controller 29 is electrically connected to the components of the substrate processing apparatus 2 such as the MFCs 10 and 13, the valves 11 and 14, the pressure sensor 16, the APC valve 17, the vacuum pump 18, the heater 3, the temperature detector 28, the rotator 23 and the boat elevator 27, and is configured to receive signals from the components described above or to control the components described above.

Figure 2:
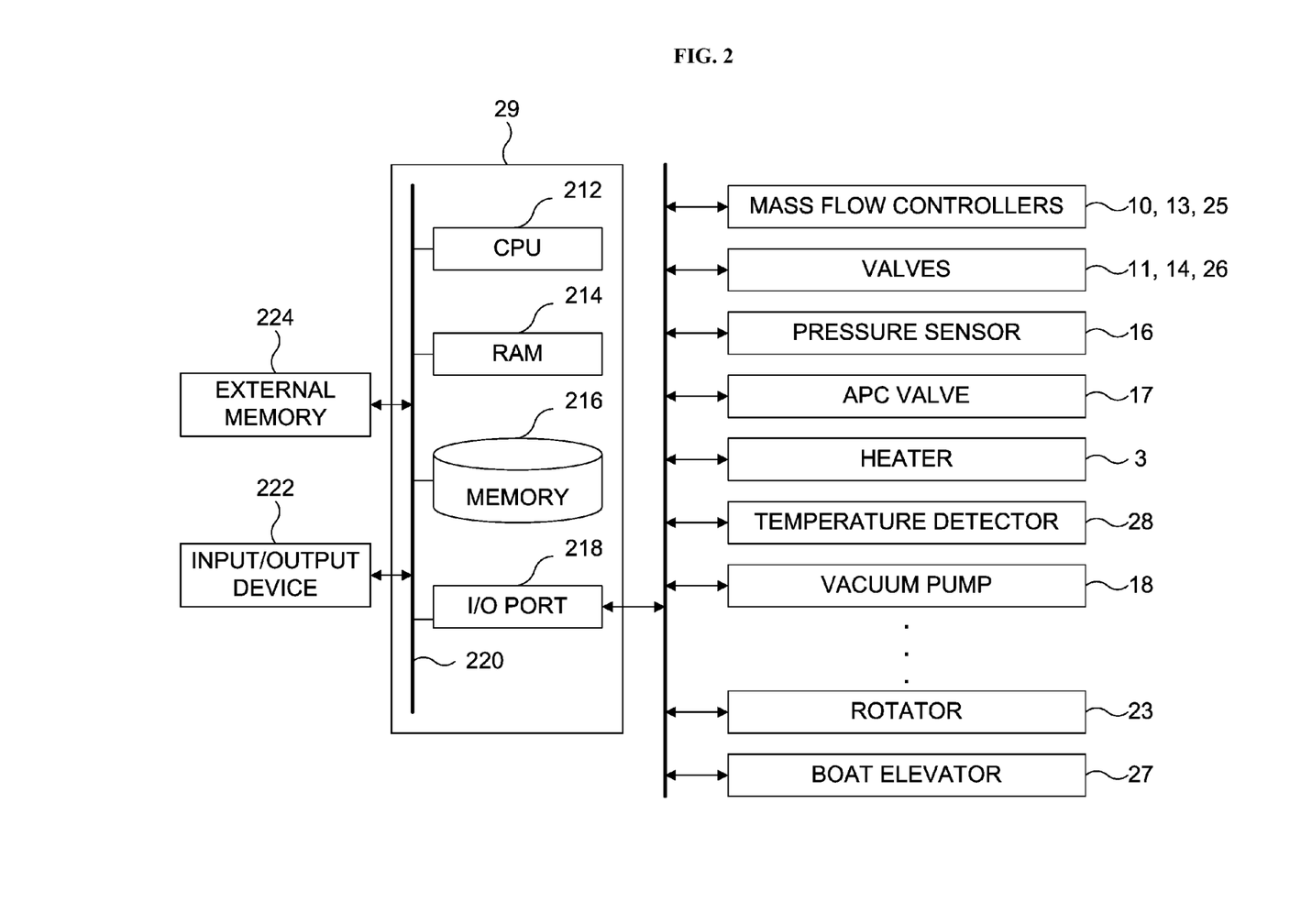
FIG. 2 is a block diagram schematically illustrating a configuration of a controller and related components of the substrate processing apparatus according to the embodiments described herein.

As shown in FIG. 2, the controller 29 shown in FIG. 1 is electrically connected to the components of the substrate processing apparatus 2 such as the MFCs 10, 13 and 25, the valves 11, 14 and 26, the pressure sensor 16, the APC valve 17, the vacuum pump 18, the heater 3, the temperature detector 28, the rotator 23 and the boat elevator 27, and is configured to automatically control the components electrically connected thereto. The controller 29 is constituted by a computer including a CPU (Central Processing Unit) 212, a RAM (Random Access Memory) 214, a memory 216 and an I/O port 218. The RAM 214, the memory 216 and the I/O port 218 may exchange data with the CPU 212 through an internal bus 220. The I/O port 218 is connected to the components described above. For example, an input/output device 222 such as a touch panel is connected to the controller 29.

The memory 216 is configured by components such as a flash memory and a hard disk drive (HDD). For example, a control program for controlling the operation of the substrate processing apparatus 2 or a program (for example, a recipe such as a process recipe and a cleaning recipe) configured to control the components of the substrate processing apparatus 2 according to the process conditions to perform a substrate processing such as a film-forming process is readably stored in the memory 216. The RAM 214 functions as a memory area (work area) where a program or data read by the CPU 212 is temporarily stored. The CPU 212 is configured to read the control program from the memory 216 and execute the read control program. In addition, the CPU 212 is configured to read the recipe from the memory 216 in accordance with an operation command inputted from the input/output device 222. According to the contents of the read recipe, the CPU 212 is configured to control the components of the substrate processing apparatus 2.

The controller 29 may be embodied by installing the above-described program stored in an external memory 224 in a non-transitory manner into a computer. For example, the external memory 224 may include a semiconductor memory such as a USB memory and a memory card, an optical disk such as a CD and a DVD and a hard disk drive (HDD). The memory 216 or the external memory 224 may be embodied by a non-transitory tangible computer-readable recording medium. Hereafter, the memory 216 and the external memory 224 may be collectively or individually referred to as "recording medium". Instead of the external memory 224, a communication means such as the Internet and a dedicated line may be used for providing the program to the computer.

(2) Substrate Processing (Film-Forming Process)

Figure 3:
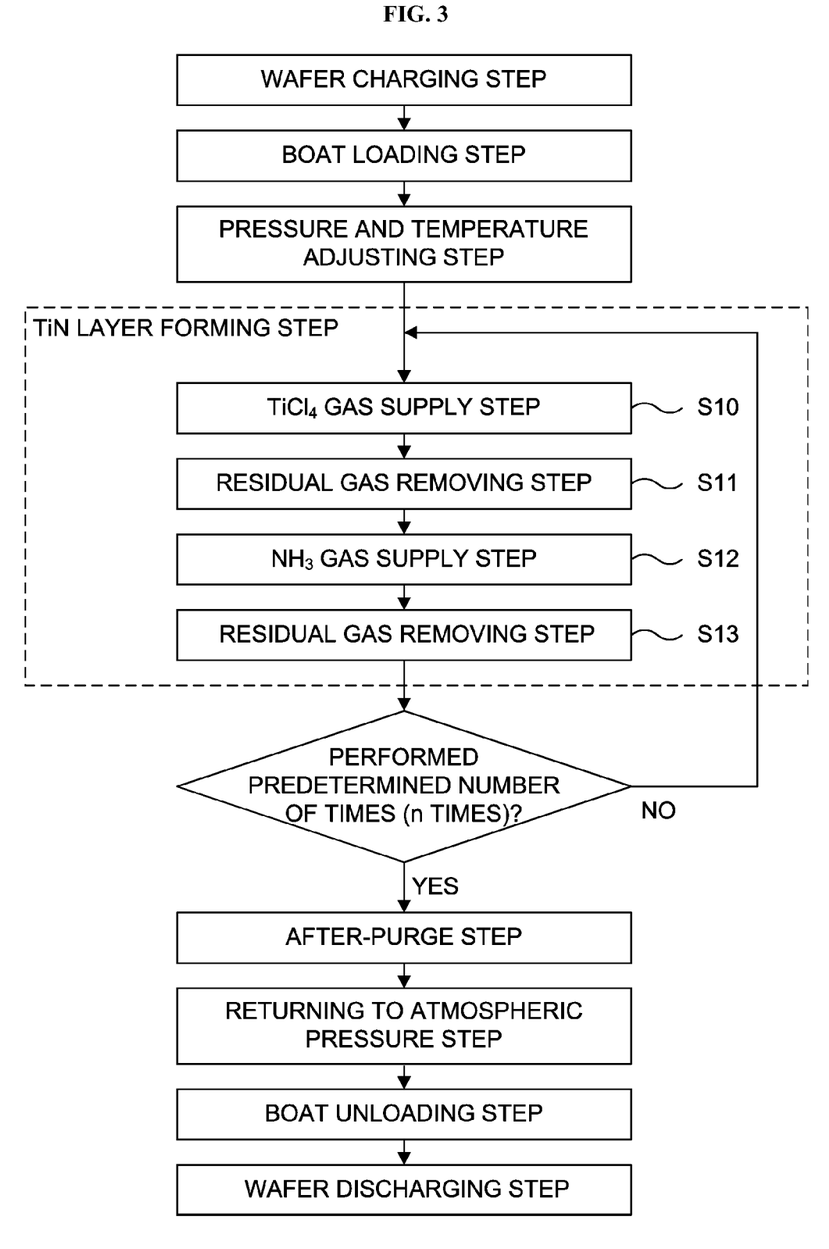
FIG. 3 is a flow chart schematically illustrating an exemplary substrate processing of the substrate processing apparatus according to the embodiments described herein.

With reference to FIG. 3, a step of forming a titanium nitride layer (TiN layer), which is an example of a step of forming a metal film on the wafer 7, will be described. The step of forming the metal film is a part of manufacturing processes of a semiconductor device, and is performed as the substrate processing (film-forming process). The step of forming the metal layer such as the TiN layer is performed using the process chamber 6 of the reaction tube 4 of the substrate processing apparatus 2 described above. As described above, manufacturing processes of FIG. 3 are performed by executing the program by the CPU 212 of the controller 29.

The substrate processing (that is, the manufacturing processes of the semiconductor device) according to the embodiments includes: (a) a step of supplying the TiCl$_4$ gas to the wafer 7 accommodated in the process chamber 6; (b) a step of removing a residual gas in the process chamber 6; (c) a step of supplying the NH$_3$ to the wafer 7 accommodated in the process chamber 6; and (d) a step of removing the residual gas in the process chamber 6. By repeatedly performing the steps (a) through (d) described above a plurality of times, the TiN layer is formed on the wafer 7.

In the present specification, the term "wafer" may refer to "a wafer itself" or may refer to "a wafer and a stacked structure (aggregated structure) of predetermined layers or films formed on a surface of the wafer". That is, the term "wafer" may collectively refer to "the wafer and the layers or the films formed on the surface of the wafer. In addition, in the present specification, the term "a surface of a wafer" may refer to "a surface (exposed surface) of a wafer itself" or may refer to "a surface of a predetermined layer or a film formed on the wafer, i.e. a top surface (uppermost surface) of the wafer as the stacked structure". In the present specification, the terms "substrate" and "wafer" may be used as substantially the same meaning.

Wafer Charging Step and Boat Loading Step

The wafers including the wafer 7 are charged (transferred) into the boat 21 (wafer charging step). After the boat 21 is charged with the wafers, as shown in FIG. 1, the boat 21 charged with the wafers is elevated by the boat elevator 27 and loaded (transferred) into the process chamber 6 (boat loading step). With the boat 21 loaded, the seal cap 19 seals the lower end opening of the reaction tube 4 via the O-ring 19A.

Pressure and Temperature Adjusting Step

The vacuum pump 18 exhausts (vacuum-exhausts) the inner atmosphere of the process chamber 6 until the inner pressure of the process chamber 6 reaches and is maintained at a predetermined pressure (vacuum degree). While exhausting the inner atmosphere of the process chamber 6, the inner pressure of the process chamber 6 is measured by the pressure sensor 16, and the APC valve 17 is feedback-controlled based on the measured pressure information (pressure adjusting step). The vacuum pump 18 continuously vacuum-exhausts the inner atmosphere of the process chamber 6 until at least the processing of the wafer 7 is completed. The heater 3 heats the process chamber 6 until the inner temperature of the process chamber 6 reaches and is maintained at a desired temperature. The state of the electric conduction to the heater 3 is feedback-controlled based on the temperature information detected by the temperature detector 28 such that a desired temperature distribution of the inner temperature of the process chamber 6 can be obtained (temperature adjusting step). The heater 3 continuously heats the process chamber 6 until at least the processing of the wafer 7 is completed.

TiN Layer Forming Step

Subsequently, the step of forming the TiN layer such as a metal nitride layer serving as a first metal layer is performed.

TiCl$_4$ Gas Supply Step S10

The valve 11 for the TiCl$_4$ gas is opened to supply the TiCl$_4$ gas serving as the source gas into the gas supply pipe 9 for the TiCl$_4$ gas. A flow rate of the TiCl$_4$ gas supplied into the gas supply pipe 9 for the TiCl$_4$ gas is adjusted by the MFC 10 for the TiCl$_4$ gas. The TiCl$_4$ gas whose flow rate is adjusted is then supplied into the process chamber 6 through the gas supply holes 8H of the nozzle 8 for the TiCl$_4$ gas, and is exhausted through the exhaust pipe 15. Thereby, the TiCl$_4$ gas is supplied to the wafers including the wafer 7. In parallel with the supply of the TiCl$_4$ gas, the valve 14 related to the gas supply pipe 9 for the TiCl$_4$ gas is opened to supply the inert gas such as the N$_2$ gas into the gas supply pipe 12 related to the gas supply pipe 9 for the TiCl$_4$ gas. A flow rate of the N$_2$ gas supplied into the gas supply pipe 12 related to the gas supply pipe 9 for the TiCl$_4$ gas is adjusted by the MFC 13 related to the gas supply pipe 9 for the TiCl$_4$ gas. The N$_2$ gas whose flow rate is adjusted is then supplied into the process chamber 6 together with the TiCl$_4$ gas, and is exhausted through the exhaust pipe 15. The N$_2$ gas is supplied into the process chamber 6 through the gas supply pipe 12 related to the gas supply pipe 9 for the TiCl$_4$ gas and the nozzle 8 for the TiCl$_4$ gas, and is exhausted through the exhaust pipe 15. When the N$_2$ gas is supplied, for example, the temperature of the heater 3 is set such that the temperature of the wafer 7 reaches and is maintained at a temperature ranging from 250° C. to 550° C.

In the TiCl$_4$ gas supply step S10, the TiCl$_4$ gas and the N$_2$ gas are supplied into the process chamber 6 without any other gas being supplied into the process chamber 6 together with the TiCl$_4$ gas and the N$_2$ gas. By supplying the TiCl$_4$ gas, a titanium-containing layer whose thickness is, for example, within a range from less than a single atomic layer to several atomic layers is formed on the wafer 7 (that is, on a base film on a surface of the wafer 7).

Residual Gas Removing Step S11

After the titanium-containing layer is formed, the valve 11 for the TiCl$_4$ gas is closed to stop the supply of the TiCl$_4$ gas. In the residual gas removing step S11, with the APC valve 17 of the exhaust pipe 15 open, the vacuum pump 18 vacuum-exhausts the inner atmosphere of the process chamber 6 to remove a residual gas in the process chamber 6 such as the TiCl$_4$ gas which did not react or which contributed to the formation of the titanium-containing layer from the process chamber 6. In the residual gas removing step S11, with the valve 14 related to the gas supply pipe 9 for the TiCl$_4$ gas open, the N$_2$ gas is continuously supplied into the process chamber 6. The N$_2$ gas serves as a purge gas, which improves the efficiency of removing the residual gas in the process chamber 6 such as the TiCl$_4$ gas which did not react or which contributed to the formation of the titanium-containing layer from the process chamber 6.

NH$_3$ Gas Supply Step S12

After the residual gas in the process chamber 6 is removed from the process chamber 6, the valve 11 for the NH$_3$ gas is opened to supply a nitrogen-containing gas such as the NH$_3$ gas serving as the reactive gas into the gas supply pipe 9 for the NH$_3$ gas. A flow rate of the NH$_3$ gas supplied into the gas supply pipe 9 for the NH$_3$ gas is adjusted by the MFC 10 for the NH$_3$ gas. The NH$_3$ gas whose flow rate is adjusted is then supplied into the process chamber 6 through the gas supply holes 8H of the nozzle 8 for the NH$_3$ gas, and is exhausted through the exhaust pipe 15. Thereby, the NH$_3$ gas is supplied to the wafers including the wafer 7. In the NH$_3$ gas supply step S12, the valve 14 related to the gas supply pipe 9 for the NH$_3$ gas is closed in order to prevent the N$_2$ gas from being supplied into the process chamber 6 together with the NH$_3$ gas. That is, the NH$_3$ gas is supplied into the process chamber 6 without being diluted with the N$_2$ gas, and is exhausted through the exhaust pipe 15. In parallel with the supply of the NH$_3$ gas, in order to prevent the NH$_3$ gas from entering the nozzle 8 for the TiCl$_4$ gas, the valve 14 related to the gas supply pipe 9 for the TiCl$_4$ gas is opened to supply the N$_2$ gas into the gas supply pipe 12 related to the gas supply pipe 9 for the TiCl$_4$ gas. The N$_2$ gas is supplied into the process chamber 6 through the gas supply pipe 12 related to the gas supply pipe 9 for the TiCl$_4$ gas and the nozzle 8 for the TiCl$_4$ gas, and is exhausted through the exhaust pipe 15. In the NH$_3$ gas supply step S12, the reactive gas (that is, the NH$_3$ gas) is supplied into the process chamber 6 without being diluted with the N$_2$ gas. Thus, it is possible to improve a film-forming rate of the TiN layer. It is also possible to adjust an atmosphere concentration of the N$_2$ gas in the vicinity of the wafers including the wafer 7. In the NH$_3$ gas supply step S12, the temperature of the heater 3 is set to the same temperature as that of the TiCl$_4$ gas supply step S10.

In the NH$_3$ gas supply step S12, the NH$_3$ gas and the N$_2$ gas are supplied into the process chamber 6 without any other gas being supplied into the process chamber 6 together with the NH$_3$ gas and the N$_2$ gas. A substitution reaction occurs between the NH$_3$ gas and at least a portion of the titanium-containing layer formed on the wafer 7 in the TiCl$_4$ gas supply step S10. During the substitution reaction, titanium (Ti) contained in the titanium-containing layer and nitrogen (N) contained in the NH$_3$ gas are bonded. As a result, the TiN layer containing titanium and nitrogen is formed on the wafer 7.

Residual Gas Removing Step S13

After the TiN layer is formed, the valve 11 for the NH$_3$ gas is closed to stop the supply of the NH$_3$ gas. Then, a residual gas in the process chamber 6 such as the NH$_3$ gas which did not react or which contributed to the formation of the TiN layer and reaction byproducts is removed from the process chamber 6 in the same manners as in the residual gas removing step S11.

Performing a Predetermined Number of Times

By performing a cycle wherein the step S10 through the step S13 described above are sequentially performed in order at least once (that is, a predetermined number of times (n times)), the TiN layer of a predetermined thickness (for example, 0.1 nm to 2 nm) is formed on the wafer 7. It is preferable that the cycle described above is repeatedly performed a plurality of times, for example, preferably about 10 times to 80 times, and more preferably about 10 times to 15 times.

After-purge Step and Returning to Atmospheric Pressure Step

The N$_2$ gas is supplied into the process chamber 6 through each of the gas supply pipe 12 for the TiCl$_4$ gas and the gas supply pipe 12 for the NH$_3$ gas, and is exhausted through the exhaust pipe 15. The N$_2$ gas serves as the purge gas, and the inner atmosphere of the process chamber 6 is purged with the N$_2$ gas. Thereby, the residual gas in the process chamber 6 or the by-products remaining in the process chamber 6 are removed from the process chamber 6 (after-purge step). Thereafter, the inner atmosphere of the process chamber 6 is replaced with the inert gas (substitution by the inert gas), and the inner pressure of the process chamber 6 is returned to the normal pressure (atmospheric pressure) (returning to the atmospheric pressure step).

Boat Unloading Step and Wafer Discharging Step

Thereafter, the seal cap 19 is lowered by the boat elevator 27 and the lower end of the reaction tube 4 is opened. The boat 21 with the processed wafers including the wafer 7 charged therein is unloaded out of the reaction tube 4 through the lower end of the reaction tube 4 (boat unloading step). Then, the processed wafers including the wafer 7 are transferred (discharged) from the boat 21 (wafer discharging step).

First Example

A first example of the embodiments is an example of a substrate processing apparatus capable of suppressing a thickness fluctuation of a film due to a change in the number of a plurality of substrates to be charged. That is, the first example is an exemplary configuration of the substrate processing apparatus including: a process chamber capable of accommodating the plurality of the substrates; a gas supplier configured to supply a process gas to the plurality of the substrates in the process chamber; and a gas exhauster configured to discharge the process gas from the process chamber, wherein a plurality of disks are interposed between the plurality of the substrates, respectively, and in vicinity of back surfaces (i.e., lower surfaces) of the plurality of the substrates.

Figure 4:
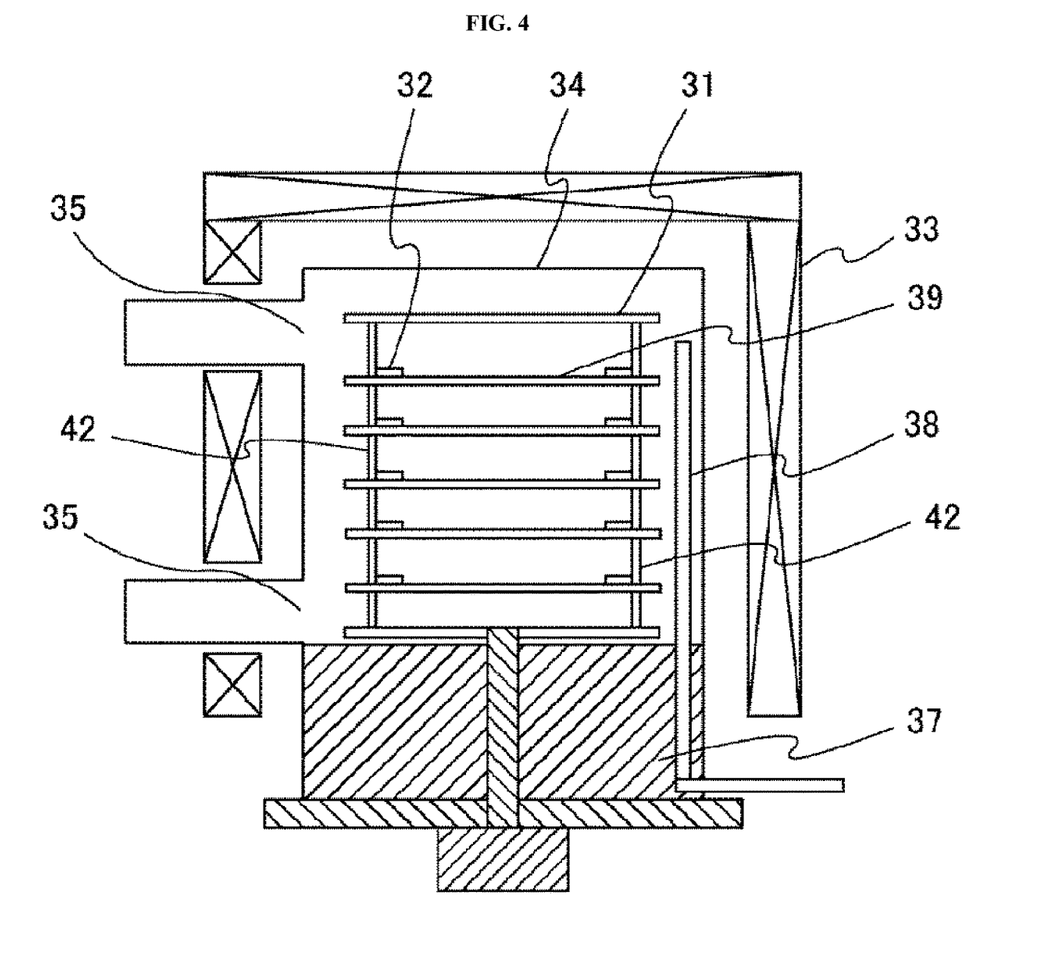
FIG. 4 schematically illustrates a vertical cross-section of an exemplary configuration of a substrate processing apparatus according to a first example described herein.

FIG. 4 schematically illustrates a vertical cross-section of the exemplary configuration of the substrate processing apparatus according to the first example described herein. As shown in FIG. 4, a plurality of disks including a disk 39 such as a quartz plate are vertically provided on a boat 31 which is a substrate retainer installed in a first reaction tube 34 serving as a single tube of the substrate processing apparatus. The plurality of the disks may also be simply referred to as disks 39. Thereby, a process region capable of performing a dummy-less operation is provided. The disks 39 are fixed to a plurality of support columns 42 of the boat 31. That is, the boat 31 is provided with the support columns 42. The support columns 42 are provided with a plurality of substrate supports 32 configured to support the plurality of the substrates, respectively. The disks 39 are fixed to the support columns 42. It is preferable that the support columns 42 of the boat 31 and the disks 39 are formed as an integrated body. A heat insulating region 37 is provided below the process region. By isolating the heat insulating region 37 from the process region and by limiting a space through which the process gas flows, it is possible improve a gas supply efficiency and a gas exhaust efficiency. That is, by providing the heat insulating region 37 made of a heat insulating material and isolated from the process region below the process region where the boat 31 of the first reaction tube 34 is installed, the space through which the process gas flows can be limited. Thereby, it is possible to improve the gas supply efficiency and the gas exhaust efficiency. A circumference of the boat 31 is covered with a heater 33 for use in heating, and the boat 31 may be cleaned by replacing the boat 31. Alternatively, the boat 31 may be cleaned by supplying a cleaning gas into the first reaction pipe 34.

Figure 6:
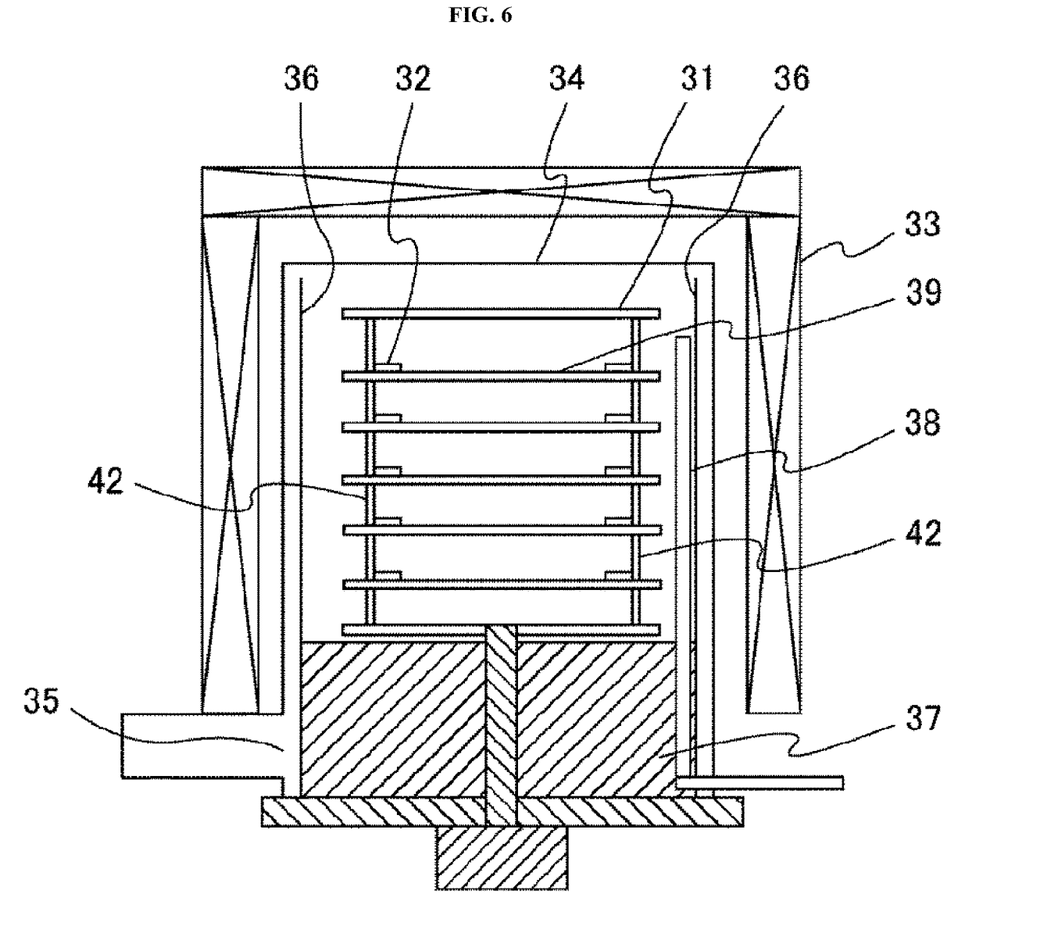
FIG. 6 schematically illustrates a vertical cross-section of another exemplary configuration of the substrate processing apparatus according to the first example described herein.

In the exemplary configuration of FIG. 4, the first reaction tube 34 is provided with two exhaust ports 35. However, as shown in FIG. 6, the first reaction tube 34 may be provided with at least one exhaust port 35. At least one nozzle 38 is inserted into the first reaction tube 34, and the process gas is introduced into the process region. The substrate supports 32 are installed on each of the support columns 42 of the boat 31. By providing, as the support columns 42, three support columns arranged at the same angular distance of 120° between each other, it is possible to suppress an eccentricity in the thickness of the film.

In FIG. 4, the substrate processing apparatus of a single tube configuration is illustrated. However, the configuration of the first example may also be applied to a substrate processing apparatus of a double tube configuration as shown in FIG. 6. According to the substrate processing apparatus of the double tube configuration, the first reaction tube 34 serving as an outer tube is arranged inside the heater 33, and a second reaction tube 36 serving as an inner tube is installed inside the first reaction tube 34. Then, the boat 31 constituting the process region is installed inside the second reaction tube 36. The other components of the substrate processing apparatus of the double tube configuration may be the same as those of the substrate processing apparatus of the single tube configuration shown in FIG. 4.

Hereinafter, a preferable configuration of a substrate retainer will be described based on the substrate processing apparatus of the single tube configuration. However, the same can be applied to the substrate processing apparatus of the double tube configuration. In the present embodiment, the substrate supports 32 are provided at positions where a space above an upper surface of each substrate supported by each of the substrate supports 32 (that is, a space between the upper surface of each substrate and its upper adjacent disk among the disks 39) is greater than a space below a lower surface of each substrate supported by each of the substrate supports 32 (that is, a space between the lower surface of each substrate and its lower adjacent disk among the disks 39). Thereby, it is possible to supply the gas onto a surface of each substrate. That is, the substrate supports 32 are provided such that the space above the upper surface of each substrate is greater than the space below the lower surface of each substrate.

Figure 5:
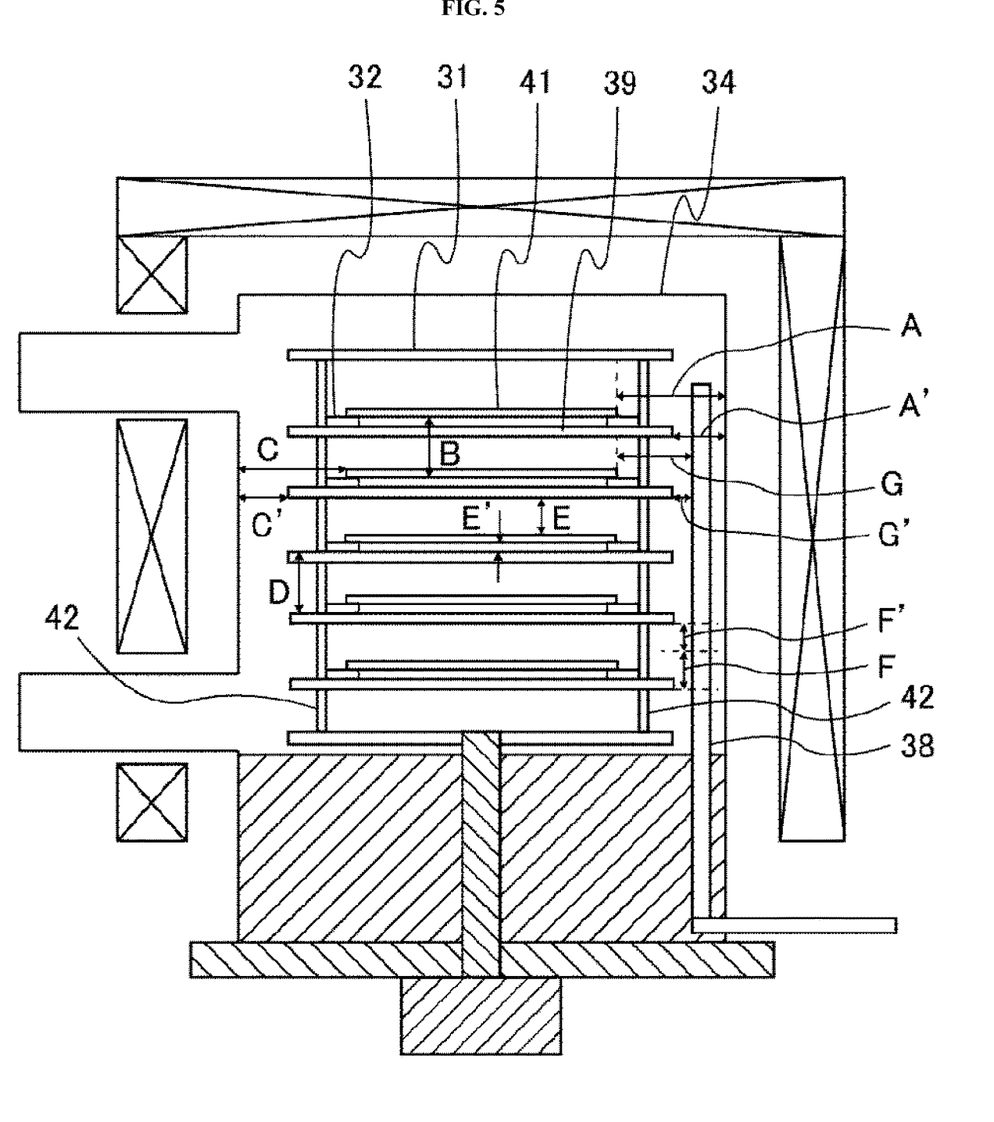
FIG. 5 is a diagram for explaining distances between components in a process chamber of the substrate processing apparatus according to the first example described herein.

FIG. 5 schematically illustrates a state in which the substrates including a substrate 41 are arranged on the substrate supports 32 installed on the support columns 42 of the boat 31 serving as the substrate retainer of the configuration according to the present embodiment. The substrates may also be referred to as substrates 41. The symbols "A" through "G" in FIG. 5 indicate the distances between the components in the first reaction tube 34. The symbol A indicates the distance between an edge of the substrate 41 and a wall of the first reaction tube 34, the symbol A' indicates the distance between an edge of the disk 39 and the wall of the first reaction tube 34, the symbol B indicates the distance (which is a wafer pitch) between adjacent substrates among the substrates 41, the symbol C indicates the distance between the edge of the substrate 41 and the other wall of the first reaction tube 34, the symbol C' indicates the distance between the edge of the disk 39 and the other wall of the first reaction tube 34, and the symbol D indicates the distance between adjacent disks among the disks 39. Further, each of the symbol E and the symbol E' indicates the distance between the disk 39 and the substrate 41, wherein the symbol E indicates a distance between an upper surface of the substrate 41 and its upper adjacent disk among the disks 39, and the symbol E' indicates a distance between a lower surface of the substrate 41 and its lower adjacent disk among the disks 39. Herein, a relationship of D=E+E' is satisfied.

Preferably, a relationship of D=E+E'+(a thickness of the substrate)+(a thickness of the disk) is satisfied. Further, the distance E' between a back surface (i.e., lower surface) of the substrate 41 and the disk 39 is greater than the distance A' between the edge of the disk 39 and a wall of the process chamber (that is, the wall of the first reaction tube 34).

Each of the symbol F and the symbol F' indicates a distance between a hole of the nozzle 38 and a back surface (i.e., lower surface) of its adjacent disk among the disks 39, wherein the symbol F indicates a distance between the hole and a back surface of its upper adjacent disk among the disks 39, and the symbol F' indicates a distance between the hole and a back surface of its lower adjacent disk among the disks 39. In the configuration of FIG. 5, a relationship of F=E'+(E/2) or a relationship of F'=E/2 is satisfied. Although a single hole position is illustrated in FIG. 5, actually a plurality of holes are provided at the nozzle 38. That is, the disks 39 and the substrate supports 32 are configured such that each of the holes of the nozzle 38 is located substantially halfway between each substrate and its upper adjacent disk. As a result, it is possible to uniformly supply the reactive gas to the surface of the substrate. The symbol G and the symbol G' indicate a distance between the nozzle 38 and the edge of the substrate 41 and a distance between the nozzle 38 and the edge of the disk 39, respectively. According to the substrate processing apparatus of the double tube configuration shown in FIG. 6, the distances A, A', C and C' between the components are measured from a wall of the second reaction tube 36 which is the inner tube.

As a common feature of the substrate processing apparatus of the present embodiment, relationships of B>C', A>C', A C and A'≈C' are satisfied regardless of the type of the process gas introduced through the nozzle 38. The value of B (that is, the distance between adjacent substrates among the substrates 41) may be changed depending on a reaction mechanism or decomposition characteristics of the process gas.

When forming the film by a reaction whose main reaction involves a small amount of the decomposition of the process gas (for example, in a case where the process gas introduced into the reaction tube is supplied to the substrates 41 without being decomposed), relationships of B>A and B>C are satisfied. That is, when forming the film by the reaction involving a small amount of the decomposition of the process gas (for example, in a case where the $TiCl_4$ gas is supplied in the film-forming process of forming the TiN layer) the distance B between adjacent substrates among the substrates 41 is set greater than the distance A between the edge of the substrate 41 and the wall of the process chamber (that is, the first reaction tube 34) and the distance C between the edge of the substrate 41 and the other wall of the process chamber (that is, the first reaction tube 34).

On the other hand, when forming the film by a reaction whose main reaction involves a large amount of the decomposition of the process gas (for example, in a case where the process gas introduced into the reaction tube is decomposed and supplied to the substrates 41), relationships of A≥B, B≤C and B>C' are satisfied. That is, when $Si_2Cl_6$ gas is supplied in a film-forming process of forming a silicon oxide (SiO), the distance B between adjacent substrates is set greater than the distance between the edge of the substrate 41 and the wall of the process chamber.

By changing each dimension as described above, it is possible to change the state of the gas supplied onto the substrate.

Hereinafter, specific numerical examples of the distances A though F are shown in FIG. 5. First, as a common feature regardless of the type of the process gas, the distance C is the same as the distance A, the distances A' and C' may range from 5 mm to 7.5 mm, the distance D is the same as the distance B, the distance E may range from 20 mm to 50 mm, and a lower limit of the distance E' is 10 mm as a minimum gap for inserting tweezers. Therefore, a maximum of the distance E is (B-10) mm, and a relationship of E'>A' is satisfied. The distance B may range from 30 mm to 80 mm, and the distance A may range from 20 mm to 50 mm, preferably from 30 mm to 40 mm.

When the $TiCl_4$ gas is used in the film-forming process of forming the TiN layer, the distance B is set to about 60 mm, and the distance A is set to about 30 mm to 40 mm. The film-forming conditions are set such that the inner pressure of the reaction tube (that is, the process chamber) is set to 10 Pa to 20 Pa and a gas supply flow rate is set to 300 ccm to 500 ccm.

When the $Si_2Cl_6$ gas is used in the film-forming process of forming the SiO, the distance B is set to about 30 mm, and the distance A is set to about 30 mm to 40 mm. The film-forming conditions are set such that the inner pressure of the reaction tube is set to 30 Pa and a gas supply flow rate is set to 100 ccm to 300 ccm.

In the configuration of the substrate processing apparatus shown in FIG. 5, when the distance E between the surface (upper surface) of the substrate 41 and its upper adjacent disk 39 is small, a space above the surface of the substrate 41 is narrow and the conductance on the substrate is small. Thereby, it may be difficult to obtain the effect of a jet flow (jet stream). In the present specification, the jet flow refers to a flow in which a flow velocity distribution gradually becomes flat with a constant spread width; and in the present example, a flow of the reactive gas that continues from the nozzle 38 to a center of the substrate without being interrupted by the edge of the substrate 41 (that is, the edge of the wafer). With the jet flow, it is possible to improve the supply of the gas. That is, it is possible to supply a high concentration of the gas to the center of the substrate 41. It is also possible to perform the dummy-less operation. In order to obtain the jet flow described above that enables the dummy-less operation, it is preferable that a relationship of B>A>A' is satisfied in the distances between the components described above. Further, it is preferable that a relationship of D>A>A' is satisfied. In each case, the distance B between the adjacent substrates is greater than the distance A between the edge of the substrate 41 and the wall of the process chamber (that is, the wall of the first reaction tube 34), and the distance A between the edge of the substrate 41 and the wall of the process chamber is greater than the distance A' between the edge of the disk 39 and the wall of the process chamber (that is, the wall of the first reaction tube 34).

Further, by setting the distance E between a front surface (i.e., upper surface) of the substrate 41 and its upper adjacent disk 39 and the distance E' between the back surface (i.e., lower surface) of the substrate 41 and its lower adjacent disk 39 such that a relationship of E>E' is satisfied, it is possible to easily form the jet flow. Therefore, it is possible to uniformly supply the reactive gas onto the surface of the substrate 41. As a result, it is possible to easily implement the dummy-less operation. It is also possible to suppress the formation of the film on the back surface of the substrate 41, and it is also possible to easily and uniformly heat the substrate 41. According to the study of the disclosers of the present application, in order to maximize the gas concentration at the center of the substrate 41 in the configuration shown in FIG. 5, it is preferable that the distance B between the adjacent substrates among the substrates 41 is set to substantially 50 mm to 60 mm or more. As described above, in the substrate processing apparatus according to the first example, by setting the distance B between the adjacent substrates among the substrates 41 greater than that of the conventional one and by setting the distance A between the edge of the substrate 41 and the wall (inner wall) of the first reaction tube 34 sufficiently large, it is possible to provide the reactive gas sufficiently to the center of the substrate 41.

Figure 7A:
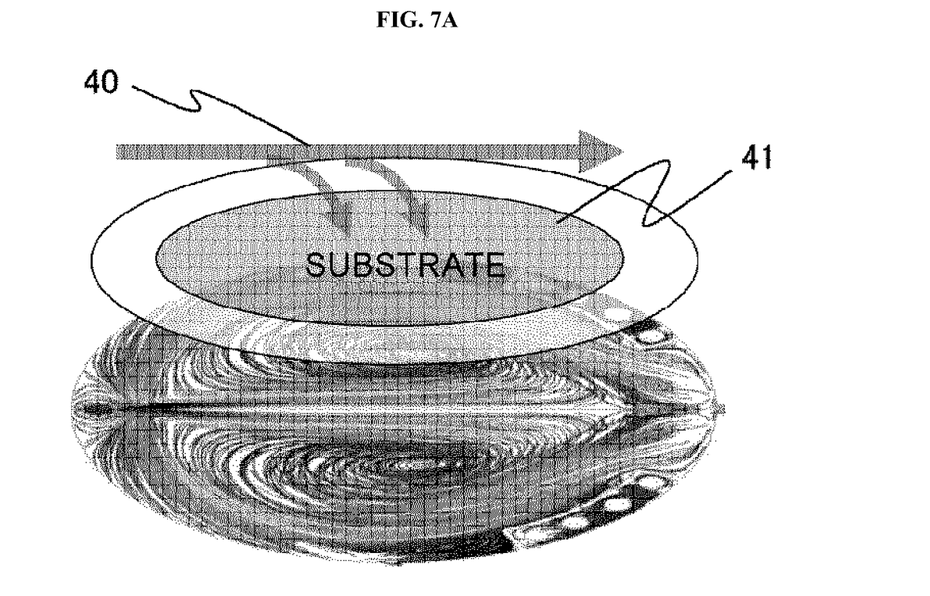
FIG. 7A is a perspective view for explaining a jet flow according to the first example described herein.
Figure 7B:
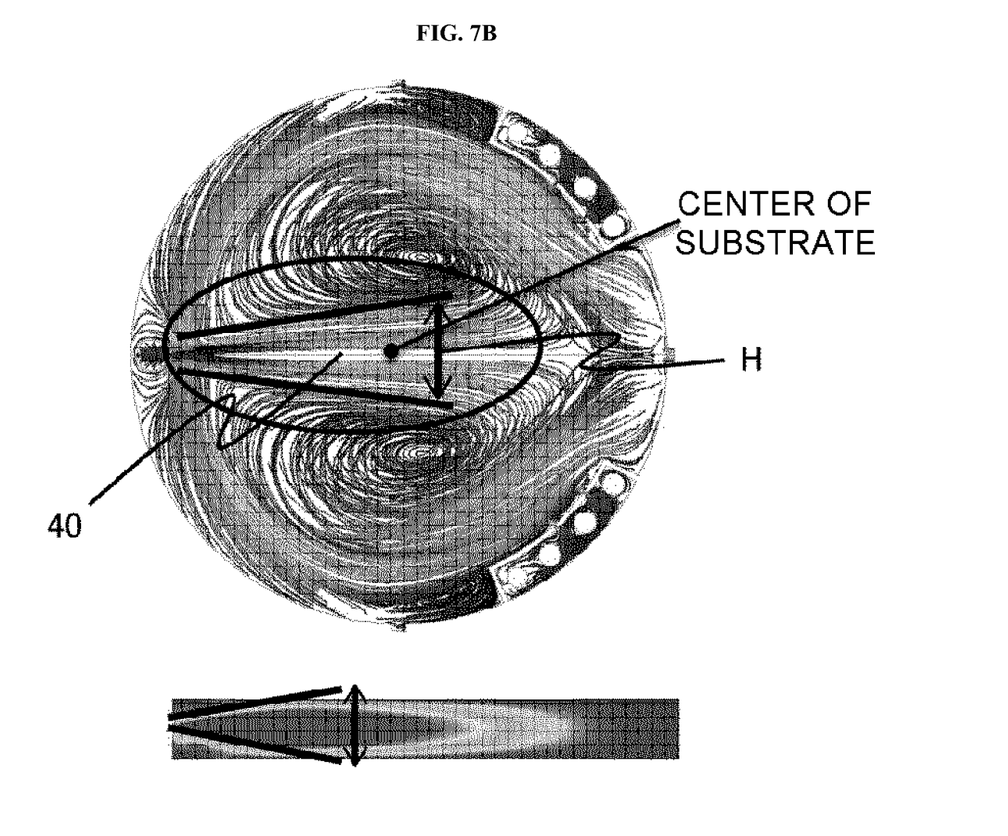
FIG. 7B is a plan view for explaining the jet flow according to the first example.

FIGS. 7A and 7B are a perspective view and a plan view for explaining the jet flow on the surface of the substrate 41 installed on the disk 39 of the substrate processing apparatus according to the present example, respectively. Further, a lower portion of FIG. 7B illustrates a vertical cross-section of a jet flow 40. As shown in FIG. 7B, according to the configuration of the present example, it is possible to obtain the jet flow 40 in which the flow velocity distribution gradually becomes flat with a constant spread width H up to the center of the substrate.

According to the configuration of the first example described above in detail, it is possible to install the disks 39 between the substrates 41, thereby suppressing the thickness fluctuation of the film due to a change in the number of the substrates to be charged, and obtaining the same film-forming result regardless of whether to process a single substrate or five substrates in the dummy-less operation.

Second Example

A second example of the embodiments is another example of the substrate processing apparatus capable of suppressing the thickness fluctuation of the film due to a change in the number of the plurality of the substrates to be charged. The difference between the first example and the second example is the configuration of the boat serving as the substrate retainer. According to the boat of the present example, the disks do not protrude outside the support columns of the boat. When the edge of the disk protrudes toward the wall of the reaction tube further than the support columns of the boat, it is possible to easily perform the dummy-less operation. However, when the edge of the disk does not protrude toward the wall of the reaction tube, it is possible to improve the uniformity of the supply of the gas to the surfaces of the substrates.

Figure 8A:
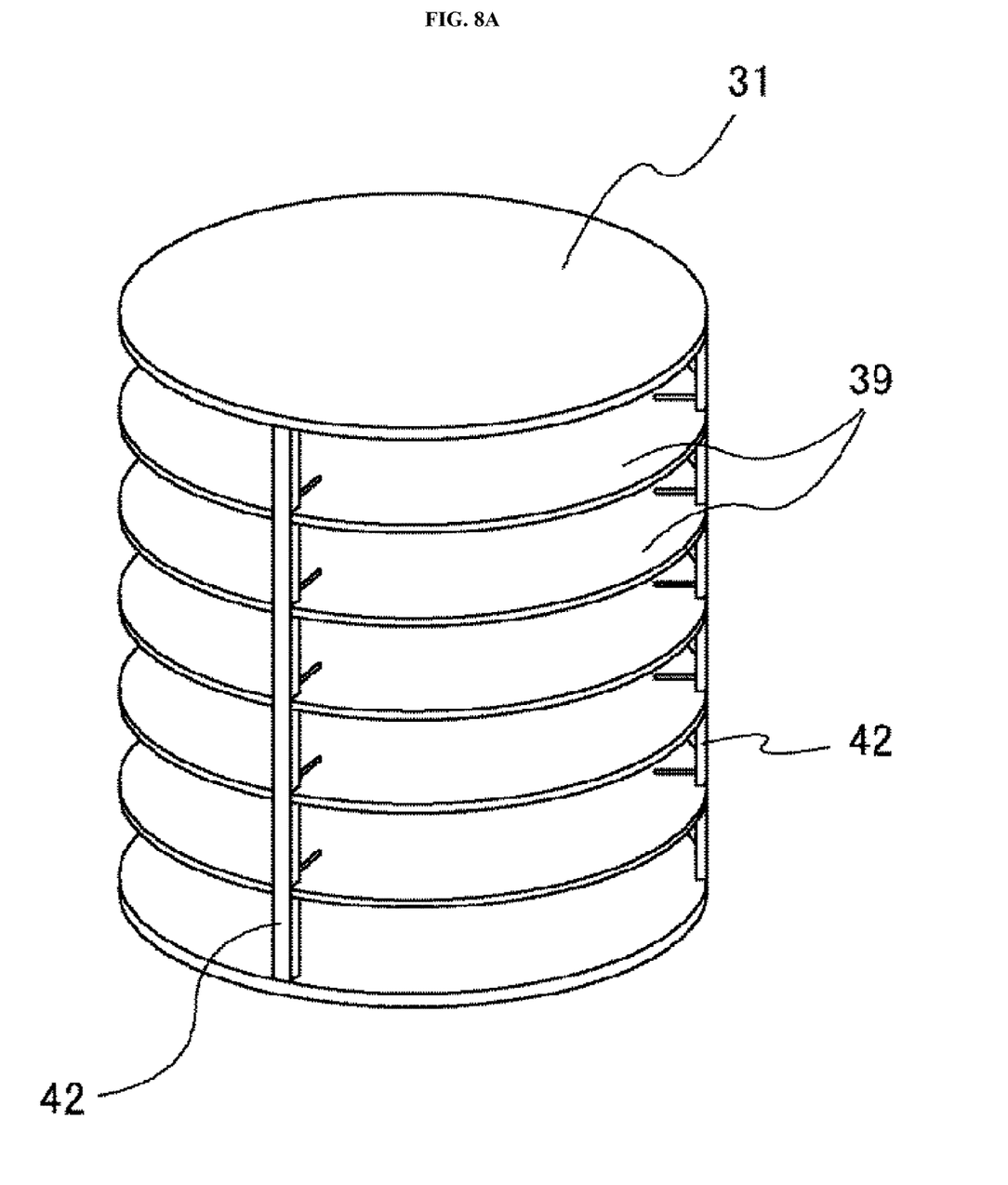
FIG. 8A is a perspective view schematically illustrating an exemplary configuration of a substrate processing apparatus according to a second example described herein.
Figure 8B:
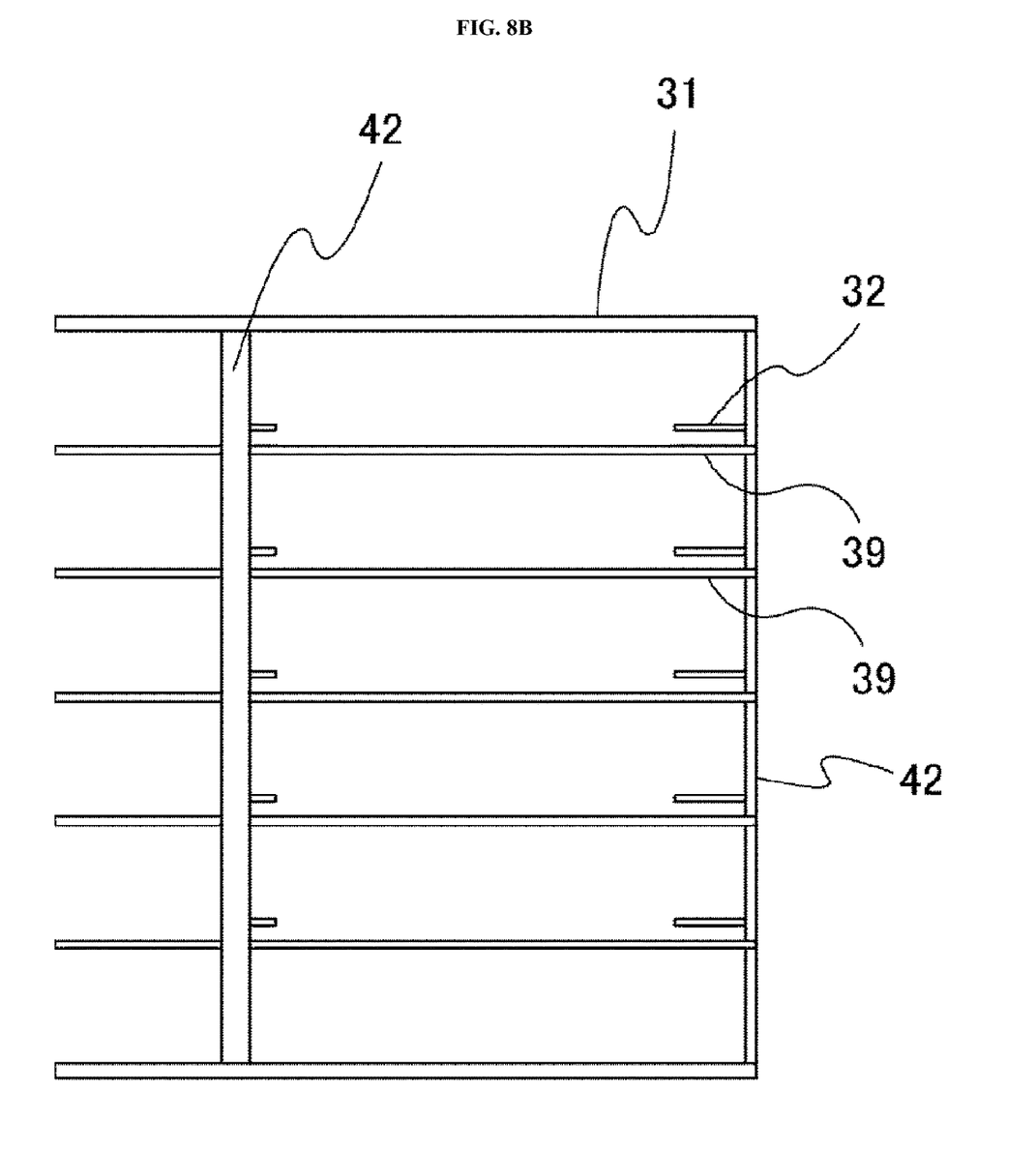
FIG. 8B is a cross-sectional view schematically illustrating a vertical cross-section of the exemplary configuration of the substrate processing apparatus according to the second example described herein.

FIGS. 8A and 8B are a perspective view and a cross-sectional view schematically illustrating another exemplary configuration of the boat of the substrate processing apparatus according to the present example, respectively. Since the other components of the substrate processing apparatus according to the present example are the same as those of the substrate processing apparatus according to the first example, the description of the other components of the substrate processing apparatus according to the present example will be omitted. By arranging the three support columns 42 of the boat 31 at the same angular distance of 120° between each other, it is possible to suppress the eccentricity in the thickness of the film. The disks 39 are formed as a single body in the three support columns 42 arranged at the same angular distance of 120° between each other.

As shown in FIGS. 8A and 8B, the edge of the disk 39 is located so as to contact the support columns 42 of the boat 31. Therefore, in the configuration of the present example, among the distances between the components described with reference to FIG. 5, the distances A' and C' between the edge of the disk 39 and the two walls of the first reaction tube 34 are equal to the distances between each of the support columns 42 of the boat 31 and the two walls of the first reaction tube 34, and the distance G between the edge of the disk 39 and the nozzle 38 is equal to the distance between each of the support columns 42 of the boat 31 and the nozzle 38. Assuming that the thickness of each of the support columns 42 of the boat 31 is set to 5 mm, the distances A and C are set to 30 mm to 40 mm, respectively, and the distances A' and C' are set to 5 mm to 7.5 mm, respectively, according to the configuration of the present example, it is possible to separate the support columns 42 from the edge of the substrate 41 by about 17.5 mm to 30 mm, and also possible to suppress a partial thinning of the film due to the support columns 42 of the boat 31. More preferably, by separating the support columns 42 by approximately 26 mm to 30 mm, that is, by separating the support columns 42 from the edge of the substrate 41 by approximately 26 mm to 30 mm, it is possible to obtain a high film-thinning inhibitory effect.

Other Embodiments

While the technique is described in detail by way of the embodiments and the examples, the above-described technique is not limited thereto. The above-described embodiments and the examples may be appropriately combined. Further, the above-described technique may also be applied to all types of films formed by the substrate processing apparatus or to all types of gases used in the substrate processing apparatus. The above-described technique is described in the present specification mainly based on the substrate processing apparatus. However, the above-described technique is also applied to the boat, a method of manufacturing a semiconductor device, a program and a non-transitory computer-readable recording medium.

While the embodiments and the examples described above are described by way of an example in which the substrate processing apparatus is capable of processing five substrates is used, the above-described technique is not limited thereto. For example, the above-described technique may also be applied to any substrate processing apparatus that is capable of forming the jet flow. Specifically, for example, the number of substrates processed by the substrate processing apparatus may range from about 1 to 15.

While the embodiments and the examples described above are described by way of an example in which the substrate processing apparatus capable of performing the film-forming process is used, the above-described technique is not limited thereto. For example, the above-described technique may also be applied to other processes. For example, the above-described technique may also be applied to a process such as a diffusion process using a plasma, an oxidation process, a nitridation process, an oxynitridation process, a reduction process, an oxidation-reduction process, an etching process and a heating process. For example, the above-described technique may also be applied to a process such as a plasma oxidation process or a plasma nitridation process of a film formed on the substrate or the surface of the substrate using the reactive gas alone. The above-described technique may also be applied to a plasma annealing process using the reactive gas alone.

For example, the embodiments and the examples described above are described by way of an example in which a titanium nitride film serving as a nitride film is formed using a titanium-containing gas as the source gas and the nitrogen-containing gas as the reactive gas. However, the above-described technique is not limited thereto. The above-described technique may not be applied to the formations of other films using different gases. For example, the above-described technique may also be applied to formations of an oxide film, an oxygen-containing film, a nitrogen-containing film, a carbon-containing film, a boron-containing film, a metal-containing film and combinations thereof. For example, the above-described technique may also be applied to formations of a silicon oxide (SiO) film, a silicon nitride (SiN) film, an aluminum oxide (AlO) film, a zirconium oxide (ZrO) film, a hafnium oxide (HfO) film, a hafnium aluminum oxide (HfAlO) film, a zirconium aluminum oxide (ZrAlO) film, a silicon carbide (SiC) film, a silicon carbonitride (SiCN) film, a silicon boronitride (SiBN) film, a titanium carbide (TiC) film and a titanium aluminum carbide (TiAlC) film.

As described above, according to some embodiments in the present disclosure, it is possible to adjust a balance in the film thickness between the surfaces of the plurality of the substrates stacked in the process chamber.

What is claimed is:

1. A substrate processing apparatus comprising:
   a process chamber capable of accommodating a plurality of substrates;
   a gas supplier configured to supply a process gas to the plurality of the substrates in the process chamber;
   a gas exhauster configured to discharge the process gas from the process chamber;
   a substrate retainer comprising a plurality of support columns provided with a plurality of substrate supports that are configured to support the plurality of substrates, respectively; and
   a plurality of disks interposed between the plurality of the substrates, respectively, and in vicinity of back surfaces of the plurality of the substrates,
   wherein the plurality of disks are placed at the plurality of support columns in a manner that the plurality of disks are located respectively beneath the plurality of substrate supports without a gap therebetween.

2. The substrate processing apparatus of claim 1, wherein the plurality of the disks are fixed to the plurality of the support columns.

3. The substrate processing apparatus of claim 1, wherein the plurality of the substrate supports are provided at the plurality of the support columns such that a space above an upper surface of each of the plurality of the substrates is greater than a space below a lower surface of each of the plurality of the substrates.

4. The substrate processing apparatus of claim 1, wherein the plurality of the support columns are separated from edges of the plurality of the substrates by substantially 26 mm to 30 mm.

5. The substrate processing apparatus of claim 1, wherein a distance between adjacent substrates among the plurality of the substrates is greater than a distance between an edge of each of the disks and a wall of the process chamber.

6. The substrate processing apparatus of claim 5, wherein the distance between the adjacent substrates is substantially 50 mm to 60 mm or more.

7. The substrate processing apparatus of claim 1, wherein the substrate retainer and the process chamber are configured such that a distance between adjacent substrates among the plurality of the substrates is greater than a distance between an edge of each of the substrates and a wall of the process chamber when forming a film by a reaction involving a small amount of decomposition of the process gas.

8. The substrate processing apparatus of claim 3, wherein the substrate retainer and the process chamber are configured such that a distance between adjacent substrates among the plurality of the substrates is greater than a distance between an edge of each of the substrates and a wall of the process chamber when forming a film by a reaction involving a small amount of decomposition of the process gas.

9. The substrate processing apparatus of claim 4, wherein the substrate retainer and the process chamber are configured such that a distance between adjacent substrates among the plurality of the substrates is greater than a distance between the edge of each of the substrates and a wall of the process chamber when forming a film by a reaction involving a small amount of decomposition of the process gas.

10. The substrate processing apparatus of claim 1, wherein the substrate retainer and the process chamber are configured such that a distance between adjacent substrates among the plurality of the substrates is smaller than a distance between an edge of each of the substrates and a wall of the process chamber when forming a film by a reaction involving a large amount of decomposition of the process gas.

11. The substrate processing apparatus of claim 3, wherein the substrate retainer and the process chamber are configured such that a distance between adjacent substrates among the plurality of the substrates is smaller than a distance between an edge of each of the substrates and a wall of the process chamber when forming a film by a reaction involving a large amount of decomposition of the process gas.

12. The substrate processing apparatus of claim 4, wherein the substrate retainer and the process chamber are configured such that a distance between adjacent substrates among the plurality of the substrates is smaller than a distance between the edge of each of the substrates and a wall of the process chamber when forming a film by a reaction involving a large amount of decomposition of the process gas.

13. The substrate processing apparatus of claim 1, wherein the gas supplier comprises a nozzle provided with a plurality of holes through which a reactive gas is supplied to the plurality of the substrates, and
wherein the gas supplier and the substrate retainer are configured such that each of the holes is located substantially halfway between one of the substrates and one of the disks.

14. The substrate processing apparatus of claim 1, wherein the process chamber comprises a heat insulating region below a process region where the substrate retainer is provided, and the heat insulating region comprises a heat insulating material and is isolated from the process region.

15. The substrate processing apparatus of claim 1, wherein the substrate retainer and the process chamber are configured such that a distance between adjacent disks among the plurality of the disks is greater than a distance between an edge of each of the disks and a wall of the process chamber.

16. The substrate processing apparatus of claim 1, wherein the substrate retainer is configured such that a distance between a back surface of each of the substrates and a disk adjacent thereto among the plurality of the disks is greater than a distance between an edge of the disk and a wall of the process chamber.

17. A substrate processing method, comprising:
(a) loading a substrate retainer where a plurality of substrates are placed into a process chamber, wherein the substrate retainer comprises:
a plurality of disks interposed between the plurality of the substrates, respectively, and in vicinity of back surfaces of the plurality of the substrates; and
a plurality of support columns provided with a plurality of substrate supports configured to support the plurality of the substrates, respectively,
wherein the plurality of disks are placed at the plurality of support columns in a manner that the plurality of disks are located respectively beneath the plurality of substrate supports without a gap therebetween;
(b) supplying a process gas to the plurality of the substrates; and
(c) exhausting the process gas.

18. A non-transitory computer-readable recording medium storing a program that causes, by a computer, a substrate processing apparatus to perform:
(a) loading a substrate retainer where a plurality of substrates are placed into a process chamber, wherein the substrate retainer comprises:
a plurality of disks interposed between the plurality of the substrates, respectively, and in vicinity of back surfaces of the plurality of the substrates; and
a plurality of support columns provided with a plurality of substrate supports configured to support the plurality of the substrates, respectively,
wherein the plurality of disks are placed at the plurality of support columns in a manner that the plurality of disks are located respectively beneath the plurality of substrate supports without a gap therebetween;
(b) supplying a process gas to the plurality of the substrates; and
(c) exhausting the process gas.

19. A method of manufacturing a semiconductor device, comprising: the substrate processing method of claim 17.

* * * * *